United States Patent [19]

Saito et al.

[11] Patent Number: 4,878,098
[45] Date of Patent: Oct. 31, 1989

[54] SEMICONDUCTOR INTEGRATED CIRCUIT DEVICE

[75] Inventors: Tamio Saito, Tokyo; Kunio Yosihara, Kawasaki, both of Japan

[73] Assignee: Kabushiki Kaisha Toshiba, Kawasaki, Japan

[21] Appl. No.: 328,747

[22] Filed: Mar. 24, 1989

Related U.S. Application Data

[63] Continuation of Ser. No. 95,216, Sep. 11, 1987, abandoned.

[30] Foreign Application Priority Data

Sep. 16, 1986 [JP] Japan .................. 61-215811
Sep. 16, 1986 [JP] Japan .................. 61-215812

[51] Int. Cl.$^4$ .................. H01L 23/48; H01L 23/14
[52] U.S. Cl. .................. 357/68; 357/80; 357/71
[58] Field of Search .................. 357/71, 68, 80, 74; 174/52.2, 68.5

[56] References Cited

U.S. PATENT DOCUMENTS

| | | | |
|---|---|---|---|
| 3,623,961 | 11/1971 | Laer | 357/71 |
| 4,472,730 | 9/1984 | Ohta | 357/71 |
| 4,528,064 | 7/1985 | Ohsawa et al. | 174/68.5 |
| 4,543,715 | 10/1985 | Iaarola et al. | 174/68.5 |
| 4,667,220 | 5/1987 | Lee et al. | 357/68 |
| 4,706,167 | 11/1987 | Sullivan | 174/68.5 |

FOREIGN PATENT DOCUMENTS 60-252992 12/1985 Japan.

OTHER PUBLICATIONS

"A New LSI Interconnection Method for IC Card", Ohuchi et al., 1986 IEMT Symposium, USA.

Primary Examiner—Rolf Hille
Assistant Examiner—S. V. Clark
Attorney, Agent, or Firm—Oblon, Spivak, McClelland, Maier & Neustadt

[57] ABSTRACT

A semiconductor integrated circuit device according to the present invention comprises a chip substrate formed of a semiconductor. Formed on a surface of the chip substrate is an integrated circuit and a plurality of chip terminals which are located to the outside of the integrated circuit, so as to be connected thereto. An electrical insulating layer covers the entire surface of the chip substrate, and conductor leads equal in number to the chip terminals are formed on the insulating layer. One end of each conductor lead is connected to a corresponding chip terminal, and the other end thereof is formed having a connecting terminal whose surface area is greater than that of each chip terminal. The connecting terminals are distributed substantially over the entire surface of the insulating layer.

10 Claims, 2 Drawing Sheets

SEMICONDUCTOR INTEGRATED CIRCUIT DEVICE

This application is a continuation of Ser. No. 095,216, filed on Sept. 11, 1987, now abandoned.

BACKGROUND OF THE INVENTION

The present invention relates to a semiconductor integrated circuit device called an IC chip and, more particularly, to a semiconductor integrated circuit device or an IC chip having improved output terminals.

Conventionally, IC chip output terminals vary in type, depending on the manner of electrical connection between themselves and the carrier substrate on which they are mounted. Prior to electrically connecting the IC chips and the carrier substrate, by use of wire bonding, for example, a plurality of input/output terminals or pads are formed on the peripheral portion of the surface of each IC chip. These pads can be electrically connected to the carrier substrate by means of wires. If the surface area of each IC chip having pads, and the surface area of each pad are both fixed, then, the greater the number of pads on the chip, the smaller the distance would be between adjacent pads. If the distance between the pads were so small as to be less than the diameter of a tool or a capillary, for handling wires, wire bonding could not then be effected. Consequently, it is not possible to provide a large number of pads on the surface of each IC chip.

Meanwhile, a generally known arrangement exists wherein the IC chip are electrically connected to the carrier substrate by means of tape-automated bonding, in place of wire bonding with the use of a capillary. Since it does not entail use of a capillary, the tape-automated bonding method is not subject to the aforementioned problems. However, according to this method, the pads can be arranged only around the peripheral portion of each IC chip. Therefore, the greater the number of pads, the smaller they must each be in area. Every increase in the number of pads must be accompanied by an increase in the mechanical accuracy of the connection between the pads and the leads. At the same time, the leads themselves must be formed with higher accuracy. Consequently, the number of pads formed on each IC chip cannot easily be increased, evey by use of the tapeautomated bonding method.

In contrast with the conventional IC chips described above, flip chips can be used with pads arranged on the entire surface thereof. Even in this case, however, the arrangment regions for the pads must be situated so as not to overlap with the active regions of the flip chips themselves. This is because the flip chips may otherwise be adversely affected by thermal stress when they are soldered to the carrier substrate. Actually, therefore, in this case also, the number of input/output terminals cannot easily be increased, even by use of flip chips.

SUMMARY OF THE INVENTION

An object of the present invention is to provide a semiconductor integrated circuit device which can permit an increase in the number of input/output terminals, and can yet improve the reliability of the electrical connection to the input/output terminals.

Another object of the invention is to provide an electronic module in which a plurality of the above mentioned semiconductor integrated circuit devices can be incorporated so an efficient manufacturing process can be realized use of integrated circuit devices.

The first object of the invention is achieved by a semiconductor integrated circuit device which comprises a chip substrate formed of a semiconductor and having a surface, the chip substrate including an integrated circuit formed on the surface of the chip substrate, and a plurality of chip terminals arranged around the peripheral edge portion of the surface, so as to be situated on the outside of the integrated circuit, and electrically connected thereto, for inputting data and outputting data from said integrated circuit; an electrical insulating layer covering the entire surface of the chip substrate; and conductor leads equal in number to that of the chip terminals and arranged on the insulating layer, so as to be electrically insulated from the integrated circuit, each of the conductor leads being connected, at one end thereof, to a corresponding chip terminal, and each having, at the other end, a connecting terminal having an area greater than that of each chip terminal, the connecting terminals of the conductor leads being distributed over the entire surface of the insulating layer.

Since, in the case of the present invention, the connecting terminals are distributed thus, the number of chip terminals, as well as connecting terminals, can be increased. Since the area of each connecting terminal is greater than that of each chip terminal, the connection of lead elements to the connecting terminals can be effected more easily than the connection of lead elements to the chip terminals. Moreover, since the integrated circuit of the chip substrate is protected by the insulating layer, the integrated circuit cannot be adversely affected by the mechanical and thermal stress during the connecting process for connecting the lead elements with the connecting terminals.

The second object of the invention is achieved by an electronic apparatus, which comprises a plurality of modules electrically connected to one another. Each module includes a carrier substrate having a plurality of semiconductor integrated circuit devices electrically connected thereto. The modules undergoes an inspection which can be executed before they are electrically connected to one another.

Since the electronic apparatus of the present invention is composed of a plurality of such modules, the inadvertent incorporation therein of a fault module is prevented. As a result, the yield of the electronic apparatus cna be maintained at a high value. Therefore, the modules or the semiconductor integrated circuit devices in each module can be utilized effectively.

DETAILED DESCRIPTION OF THE PREFERRED EMBODIMENTS

Figure 1:
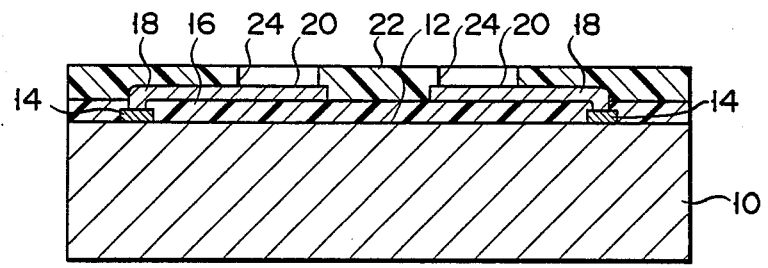
FIG. 1 is a sectional view of a semiconductor integrated circuit device according to an embodiment of the present invention, as taken along line I-I of FIG. 2.
Figure 2:
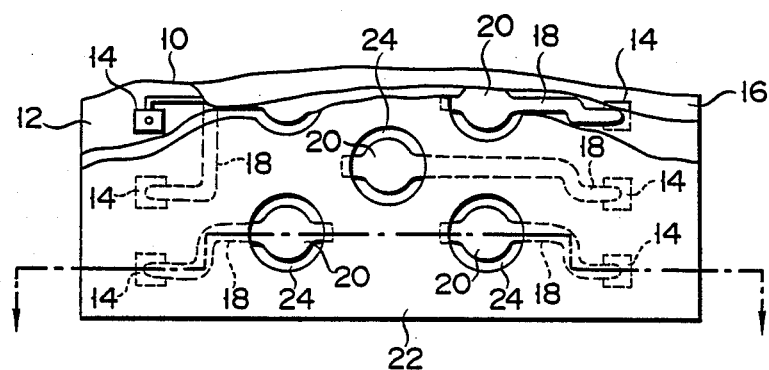
FIG. 2 is a cutaway plan view of the device shown in FIG. 1.

Referring now to FIGS. 1 and 2, there is shown a semiconductor integrated circuit device, which comprises chip substrate 10 formed of a semiconductor. An integrated circuit (not shown) is formed on one surface 12 of substrate 10. In addition, a number of chip terminals 14 are arranged on surface 12 such that they are situated on either side of the integrated circuit. Terminals 14 are electrically connected to the integrated circuit, to permit electronic signals to be input thereto or output therefrom.

First insulating layer 16 extends over all of surface 12 of chip substrate 10, and is formed of a synthetic resin, such as polyimide, epoxy, acrylic, or Teflon resin, which can be hardened by ultraviolet rays.

A plurality of elongated conductor leads 18, equal in number to that of chip terminals 14, are formed on first insulating layer 16. One end of each conductor lead 18 is connected to its corresponding chip terminal 14, with a connecting terminal 20 being formed on its other end. As can be seen from FIG. 2, each terminal 20 is circular in shape. In this embodiment, terminals 20 are distributed all over the central portion of layer 16. Also, as can be seen from FIG. 2, the surface area of each connecting terminal 20 is greater than that of each chip terminal 14, and the distance between adjacent terminals 20 is greater than that between adjacent terminals 14. In this embodiment, connecting terminals 20 are made of a past containing the powder of an electrically high conductive metal-for example, copper or silver.

Second insulating layer 22 is formed on first insulating layer 16, both these layers being formed of similar materials. Layer 22 is formed having openings 24 through which connecting terminals 20 are individually exposed to the outside.

According to the semiconductor integrated circuit device described above, connecting terminals 20 can be distributed substantially over all of the area of first insulating layer 16 which corresponds to all of surface 12 of chip substrate 10. Therefore, even if the number of chip terminals 14 is increased, the distance between adjacent connecting terminals 20 and surface area of each terminal 20 will remain sufficient. Thus, according to the device of the present invention, the number of chip terminals 14, that is, the number of connecting terminals 20, can be increased over that of the prior art, but without the disadvantages inherent therein.

First insulating layer 16 not only serves to electrically insulate conductor leads 18 from the integrated circuit on chip substrate 10, but also functions as a protective layer for the integrated circuit when connecting terminals 20 are connected electrically to an external circuit.

Figure 3:
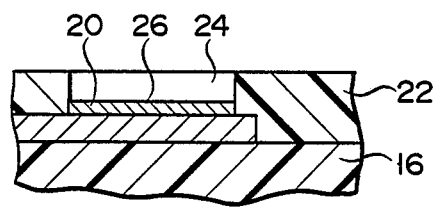
FIG. 3 is a sectional view showing a modification of a connecting terminal.

The present invention is not limited to the embodiment described above. Referring to FIG. 3, for example, plating layer 26 of nickel or copper is formed on the outer surface of each connecting terminal 20. Thus coated with layer 26, terminal 20 can be connected by soldering.

If connecting terminals 20 of the semiconductor integrated circuit device or conductor leads 18 are formed from heat-softening conductive material, terminals 20 and a carrier substrate, on which the integrated circuit device is to be mounted, can be connected electrically at a temperature of, e.g., 100° C. or thereabouts, which is lower than the necessary temperature for soldering. If connecting terminals 20 and the carrier substrate area connected in this manner, first insulating layer 16 need not always be formed of synthetic resin, and may alternatively be made of SiOx or SiNx.

Figure 4:
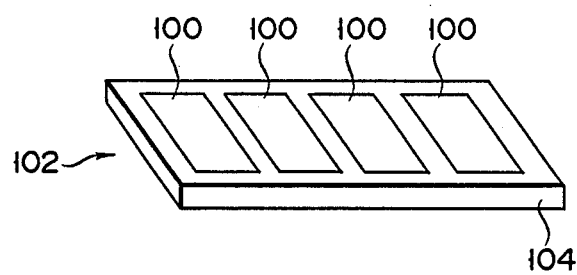
FIG. 4 is a perspective view of a module formed by combining a plurality of integrated circuit devices typified by the one shown in FIG. 1.

Referring now to FIG. 4, there is shown module 102 which is a combination of a plurality of semiconductor integrated circuit devices (hereinafter referred to simply as IC chips 100) shown in FIG. 1. In this embodiment, module 102 includes four IC chips 100 and carrier subtrate 104 carrying the chips thereon.

The number of IC chips 100 mounted on each carrier substrate 104 is determined as follows. If the yield of single IC chip 100 mounted on each substrate 104 is P, that of the combination of IC chips in module 102, i.e., the yield of the module, can be expressed as pn, where n is the number of chips 100 in each module 102. If we have P=98%, the maximum value of n to satisfy pn>90% is given by n=4.

Since yield pn of module 102 is pn>90%, as mentioned above, one module 102, as a product, out of ten can be defective. Since yield P of IC chip 100 is 98%, the number Q of nondefective IC chips in each defective module 102 is Q 32 4×0.98=3.92. The total number S of chips 100 used in manufacturing ten modules 102 is S=4×10=40, so that the percentage of those non-defective IC chips which are wasted is (Q/S)×100=9.8%.

However, if 40 such IC chips (chips 100) are mounted on one chip substrate, the yield pm of the resulting product is pm=45%, where m is 40. If 100 such products are manufactured, therefore, the number of those products which should be rejected as defectives is 55. Hence, about 55% of the IC chips will be wasted though they are nondefective.

However, yield pn of module 102 composed of four IC chips 100 is 90% (i.e., each module 102 is already checked), as described above, so that the yield of a product obtained by combining a plurality of modules 102 is also 90%. Thus, in manufacturing products by the use of a number of IC chips 100, the number of wasted nondefective IC chips 100 can be reduced substantially by forming each predetermined number of chips 100 into a module as aforesaid.

In manufacturing modules 102 first, as described above, inspection must be conducted on each module 102. If the total number of IC chips 100 used in final products is too large, modules 102 are inevitably increased in number, and therefore entail increase in cost of inspection thereof. Thus, the number of IC chips 100 incorporated in each module 102 must be determined in consideration of not only the yield but also the inspection cost for the modules. If the IC chips used in each module are four in number, for example, a resulting final product, according to the present invention, is expected to include a combination of four to six modules 102, preferably. In this point of view, so-called IC card is a suitable example of the final product.

Figure 5:
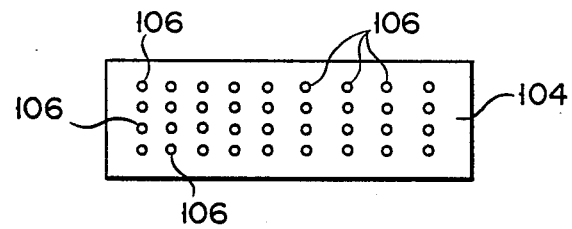
FIG. 5 is a plan view of the module shown in FIG. 4.
Figure 6:
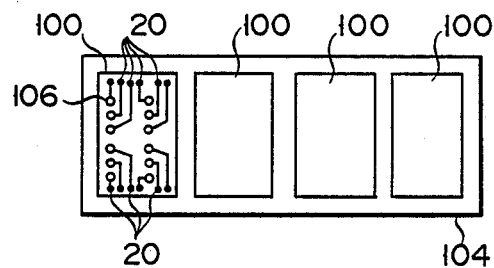
FIG. 6 is a diagram showing connections between output terminals of IC chips used in the module of FIG. 4 and those of the module itself.

As seen from FIG. 5, carrier substrate 104 shown in FIG. 4 is provided with substrate terminals 106 which are connected individually to connecting terminals 20 of IC chips 100. Referring to FIG. 6, there is shown the manner of connection between terminals 106 and 20. In FIG. 6, connecting terminals 20 of each IC chip 100 are shown as if they were arranged only at the peipheral portion of the chip, for the ease of illustration. Actually, however, they are distributed throughout the surface of each IC chip 100, as seen from FIG. 2. In this embodiment, each connecting terminal 20 is in the form of a square having a side length of about 100μ. If each connecting terminal 20 is thus large, the connection between substrate terminals 106 and connecting terminals 20 can be facilitated, in mounting IC chips 100 on carrier substrate 104.

Figure 7:
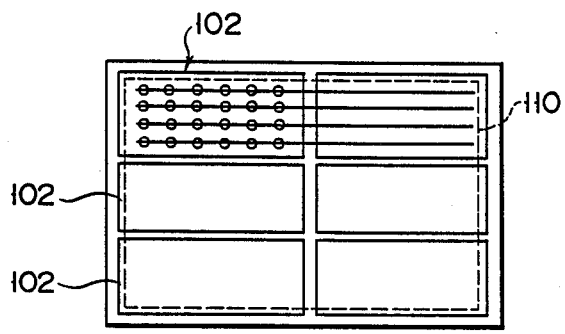
FIG. 7 is a plan view showing an apparatus formed by combining a plurality of modules typified by the one shown in FIG. 4.

As shown in FIG. 7, for example, six modules 102 are combined to form final product 108. Modules 102 are connected electrically to one another by means of wiring board 110. Board 110 may be a flexible board on which a wiring circuit is printed.

What is claimed is:

1. A semicondcutor integrated circuit device, comprising:

a circuit frame;

a plurality of carrier modules arranged and held on the same area in said circuit frame so as to be adjacent to one another, each of said carrier modules including a plurality of rectangular integrated circuit chips which are close to one another in a row on the same plane, each of said rectangular integrated circuit chips having a chip surface which is parallel to said plane, and a plurality of internal terminals arranged along a peripheral edge portion of the chip surface, the internal terminal being used for inputting and outputting data to and from said integrated circuit chip;

an electrical insulating layer which covers the entire chip surface, except for the internal terminals;

a plurality of conductor leads each of which is connected at one end to a corresponding inernal terminal of said plurality of internal terminals, said conductor leads extending along the insulating layer from the internal terminals towards a central portion of the chip surface, each of said conductor leads having a connecting terminal at its other end, said connecting terminal having an area wider than that of the corresponding internal terminal, said connecting terminals being distributed over the entire insulating layer, expect for those regions where the internal terminals are located;

first connecting means for electrically connecting said coonnecting terminals in each of said carrier modules to module terminals of the carrier module and distributing the module terminals over a connecting surface which is parallel to said plane and exposed to the outside; and second connecting means for electrically connecting the module terminals of the respective carrier modules to one another and/or to another electrical device.

2. The device according to claim 1, wherein the module terminals of said first connecting means are distributed on the entire connecting surface.

3. The device according to claim 2, wherein said second connecting means comprises a flexible printed board.

4. The device according to claim 1, wherein each of said carriage modules includes four integrated circuit chips.

5. The device according to claim 1, wherein:
said conductor leads are formed of a paste containing electrically highly conductive metal particles.

6. The device according to claim 5, wherein:
a plating layer of electrically highly conductive metal is formed on the connecting terminal of each of said conductor leads.

7. The device according to claim 5, wherein:
said connecting terminals of said conductor leads are formed of a paste prepared by mixing electrically highly conductive metal particles and heat-softening resin.

8. The device according to claim 1, wherein:
said insulating layer is formed of light-setting resin.

9. The device according to claim 8, further comprising a second insulating layer, covering the entire region of said first insulating layer except for the connecting terminal of each of said conductor leads.

10. The device acording to claim 9, wherein:
said second insulating layer is formed of light-setting resin.

* * * * *